United States Patent [19]

Ishihara et al.

[11] Patent Number: 4,818,560

[45] Date of Patent: Apr. 4, 1989

[54] METHOD FOR PREPARATION OF MULTI-LAYER STRUCTURE FILM

[75] Inventors: Shunichi Ishihara, Ebina; Jun-Ichi Hanna; Isamu Shimizu, both of Yokohama, all of Japan

[73] Assignee: Canon Kabushiki Kaisha, Tokyo, Japan

[21] Appl. No.: 945,894

[22] Filed: Dec. 24, 1986

[30] Foreign Application Priority Data

Dec. 28, 1985 [JP] Japan ................... 60-298042
[51] Int. Cl.$^4$ .................. B05D 3/06; C23C 16/22
[52] U.S. Cl. ........................ 427/38; 427/45.1; 427/248.1; 427/249; 427/255; 427/255.1; 427/255.7; 437/225
[58] Field of Search ........... 427/255.7, 255, 248.1, 427/255.2, 255.1, 86, 38, 87, 45.1, 95, 42, 249; 437/225

[56] References Cited

U.S. PATENT DOCUMENTS

| | | | |
|---|---|---|---|
| 3,473,978 | 10/1969 | Jackson et al. | 427/255.7 |
| 3,825,439 | 7/1974 | Tick | 427/248.1 |
| 3,916,034 | 10/1975 | Tsuchimoto | 427/38 |
| 4,077,818 | 3/1978 | Chu | 427/255.7 |
| 4,084,024 | 4/1978 | Schumacher | 427/215 |
| 4,217,374 | 8/1980 | Ovshinsky et al. | 427/39 |
| 4,220,488 | 9/1980 | Duchemin et al. | 148/175 |
| 4,282,267 | 8/1981 | Kuyel | 427/38 |
| 4,402,762 | 9/1983 | John et al. | 427/87 |
| 4,410,559 | 10/1983 | Hamakawa et al. | 427/39 |
| 4,419,381 | 12/1983 | Yamazaki | 427/39 |
| 4,430,185 | 2/1984 | Shimomoto et al. | 427/39 |
| 4,434,188 | 2/1984 | Kamo et al. | 427/39 |
| 4,439,463 | 3/1984 | Miller | 427/39 |
| 4,448,801 | 5/1984 | Fukuda et al. | 427/39 |
| 4,450,185 | 5/1984 | Shimizu et al. | 427/39 |
| 4,461,783 | 7/1984 | Yamazaki | 427/39 |
| 4,466,992 | 8/1984 | Dreiling | 427/39 |
| 4,468,413 | 8/1984 | Bachmann | 427/39 |
| 4,468,443 | 8/1984 | Shimizu et al. | 430/60 |
| 4,471,042 | 9/1984 | Komatsu et al. | 630/64 |
| 4,485,125 | 11/1984 | Izu et al. | 427/39 |
| 4,504,518 | 3/1985 | Ovshinsky et al. | 427/86 |
| 4,514,437 | 4/1985 | Nath | 427/39 |
| 4,517,223 | 5/1985 | Ovshinsky et al. | 427/39 |
| 4,521,447 | 6/1985 | Ovshinsky et al. | 427/39 |
| 4,522,663 | 6/1985 | Ovshinsky et al. | 427/86 |
| 4,526,805 | 7/1985 | Yashizawa | 427/38 |
| 4,532,199 | 7/1985 | Ueno et al. | 427/39 |
| 4,539,934 | 9/1985 | Fujiyama et al. | 427/39 |
| 4,543,267 | 9/1985 | Yamazaki | 427/39 |
| 4,544,423 | 10/1985 | Tsuge et al. | 427/39 |
| 4,546,008 | 10/1985 | Saitoh et al. | 427/38 |
| 4,554,180 | 11/1985 | Hirooka | 427/248.1 |
| 4,564,533 | 1/1986 | Yamazaki | 427/39 |
| 4,564,997 | 1/1986 | Matsuo et al. | 427/39 |
| 4,567,127 | 1/1986 | Saitoh et al. | 430/65 |
| 4,569,697 | 2/1986 | Tsu et al. | 427/51 |
| 4,582,560 | 4/1986 | Sanjurjo | 156/613 |
| 4,615,905 | 10/1986 | Ovshinsky et al. | 427/39 |
| 4,657,777 | 4/1987 | Hirooka | 427/39 |
| 4,664,937 | 5/1987 | Ovshinsky et al. | 427/39 |
| 4,683,145 | 7/1987 | Nishimura et al. | 427/36 |
| 4,689,093 | 8/1987 | Ishihara et al. | 427/39 |

FOREIGN PATENT DOCUMENTS

| | | |
|---|---|---|
| 74212 | 3/1983 | European Pat. Off. . |
| 90586 | 10/1983 | European Pat. Off. . |
| 138332 | 4/1984 | European Pat. Off. . |
| 140660 | 5/1985 | European Pat. Off. . |
| 3509910 | 10/1985 | Fed. Rep. of Germany . |
| 57-66625 | 4/1982 | Japan . |
| 59-199035 | 4/1983 | Japan . |
| 60-82670 | 10/1985 | Japan . |
| 2038086A | 7/1980 | United Kingdom . |
| 2148328 | 5/1985 | United Kingdom ............ 427/255.2 |
| 2156385 | 10/1985 | United Kingdom . |

OTHER PUBLICATIONS

Brodsky, et al., 22 IBM Technical Disclosure Bulletin 3391 (Jan. 1980).
Janai, et al., 52 J. Appl. Phys. 3622 (May 1981).

*Primary Examiner*—Sadie Childs
*Attorney, Agent, or Firm*—Fitzpatrick, Cella, Harper & Scinto

[57] ABSTRACT

A method for preparing a multi-layer structure film by forming a deposited film according to the chemical vapor depostion method comprises introducing a subjective starting material gas (A) which is the major flow rate component and an objective starting material gas (B) which is the minor flow rate component and hydrogen externally activated into a reaction space and controlling periodically the amount of said objective starting material gas (B) introduced to thereby form a deposited film with a multi-layer structure.

6 Claims, 1 Drawing Sheet

METHOD FOR PREPARATION OF MULTI-LAYER STRUCTURE FILM

BACKGROUND OF THE INVENTION

1. Field of the Invention

This invention relates to a method for preparation of a functional film, particularly a multi-layer structure film which is useful for uses in electronic devices such as semiconductor devices, photosensitive devices for electrophotography, optical input sensor devices for optical image inputting device, etc.

2. Related Background Art

Devices by use of amorphous or polycrystalline deposited films of multi-layer structures such as semiconductor films, insulating films, photoconductive films, magnetic films on metal films can be expected to have physical characteristics or uses not desired on deposited films of single layer structure and therefore have been studied agressively in recent years. Particularly from the standpoint of large area devices, multi-layer structure films having two or more kinds of amorphous layers laminated are attracting interest.

For example, investigations have been made to prepare multi-layer structure films having amorphous silicon (a-Si) layer and amorphous silicon carbide (a-SiC) layer, or amorphous silicon layer and amorphous silicon germanium (a-SiGe) layer laminated alternately according to the chemical vapor deposition method (CVD method) such as the plasma CVD method or the optical CVD method, and they are contemplated to be applied for a solar battery or other devices.

In particular, formation of a deposited film according to the plasma CVD method, while there is the problem that its reaction mechanism is not well understood, is now accepted as the best method in view of productivity and characteristics of the film and has been widely applied for production of solar batteries, electrophotographic photosensitive members, etc. However, there are a large number of parameters to be considered in the formation of a deposited film (for example, substrate temperature, flow rate and flow rate ratio of the introduced gases, pressure during formation, high frequency power, electrode structure, structure of the reaction vessel, speed of evacuation, plasma generating system, etc.). By use of a combination of a large number of these parameters, the plasma may sometimes become unstable state, whereby marked deleterious influences may be frequently exerted on the deposited film being formed.

Particularly, when forming a multi-layer structure film according to the plasma CVD method, it is necessary to control discharging or gas introduction every time when a new layer is applied.

However, if the amount of the gas introduced is changed to a great extent, the pressure within the reaction space will be changed, whereby the state of discharging becomes unstable which affects the structure and the characteristics of the film. Accordingly, if a multi-layer structure is formed only by controlling the amount of the gas introduced with discharging being maintained as practiced in the prior art, it is difficult to adjust the conditions so that films with good characteristics may be constantly obtained.

On the other hand, the method in which deposited films are formed by controlling discharging, namely exchanging the gases with discharging being turned off and turned on again after the pressure has reached equilibrium, will take an extremely long time to be disadvantageously poor in productivity. Also, in plasma discharging, discharging is not generally stabilized immediately after discharging is turned on, whereby the multi-layer film obtained as an interface has bad characteristics.

SUMMARY OF THE INVENTION

An object of the present invention is to provide a method for preparation of a multi-layer structure film excellent in productivity and bulk productivity, which is capable of easily producing a film of high quality excellent in physical characteristics such as electrical, optical, semiconductor characteristics, etc.

Another object of the present invention is to provide a method for preparing a multi-layer structure film by forming a deposited film according to the chemical vapor deposition method, which comprises introducing a subjective starting material gas (A) which is the major flow rate component, an objective starting material gas (B) which is the minor flow rate component and hydrogen externally activated into a reaction space and controlling periodically the amount of said objective starting material gas (B) introduced to thereby form a deposited film with a multi-layer structure.

DESCRIPTION OF THE PREFERRED EMBODIMENTS

Figure 1:
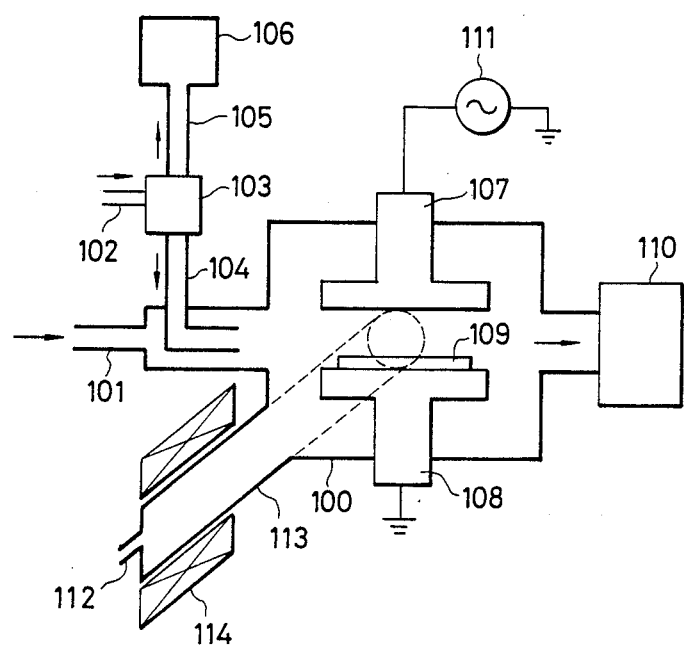
FIG. 1 illustrates schematically an example of the device for practicing the method for preparation of multi-layer structure film of the present invention.

The above object can be accomplished by a method for preparing a multi-layer structure film by forming a deposited film according to the chemical vapor deposition method, which comprises introducing a subjective starting material gas (A) which is the major flow rate component, an objective starting material gas (B) which is the minor flow rate component and hydrogen externally activated into a reaction space and controlling periodically the amount of said objective starting material gas (B) introduced to thereby form a deposited film with a multi-layer structure.

According to the method for forming a deposited film of the present invention, a multi-layer structure film having good film characteristics can be obtained simultaneously with simplification of management and bulk production with full satisfaction of enlargement of areas, uniformity of film thickness and uniformity of film quality, without requiring enormous installation investment for bulk production apparatus, and also the management items for its production become clear to afford broad management tolerance and simple control of the device.

According to the method for preparation of a multi-layer structure film of the present invention, a multi-layer structure film is constituted of two or more kinds of layers such as a multi-layer film having two kinds of layers with different physical properties laminated alternately and can be prepared easily and rapidly. Also, a multi-layer structure film can be prepared with each layer being made an extremely thin layer of, for example, 10 Å to 200 Å.

The amount (b) of the objective starting material gas (B) which is the minor flow rate component to be introduced into the reaction space relative to the amount (a) of the subjective starting material gas (A) which is the above mentioned major flow rate component may desirably be made ½(a) or less, further 1/10(a) or less.

The subjective starting material gas (A) can be constituted of a gas comprising an element to be contained in the layers forming the multi-layer structure, for example, both of the two layers with different physical properties, and can be constituted of a gas which must be introduced into the reaction space in an extremely large amount as compared with the objective starting material gas (B) because of remarkably smaller reactivity as compared with the objective starting material gas (B).

On the other hand, the objective starting material gas (B) can be constituted of a gas comprising an element to be contained in one of the layers forming the multi-layer structure, for example, the two layers with different physical properties, and can be constituted of a gas which may be introduced in smaller amount as compared with the subjective starting material gas (A) because of remarkably greater reactivity as compared with the subjective starting material gas (A).

In case a multi-layer structure film with such two kinds of gases is prepared, when forming a film containing the elements of, for example, "A" and "B", even if the subjective starting material gas (A) may be introduced in larger amount and the objective starting gas (B) in smaller amount, a film comprising elements of "A" and "B" with approximately equal elemental ratio is obtained as the result of glow discharging decomposition.

In addition, in the present invention, even when introduction of the objective starting material gas (B) into the reaction chamber is then stopped to form a film consisting only of the element of "A", the pressure change within the reaction chamber is extremely small.

Referring specifically to the case of preparation of a multi-layer structure film composed primarily of Si element, such as a multi-layer structure film of a-Si and a-SiGe, or a multi-layer structure film of a-Si and a-SiC, the subjective starting material gas (A) may be a silicon compound such as $SiF_4$, $SiCl_4$, $SiF_2Cl_2$, etc. On the other hand, examples of the starting material gas (B) may include germanium compounds such as $GeF_4$, $GeF_2Cl_2$, $GeCl_4$, etc., and carbon compounds such as $CF_4$, $C_2F_6$, $CCl_4$, etc.

For example, when a-SiGe film is to be prepared from $SiF_4$ and $GeF_4$, $SiF_4$ and $GeF_4$ may be permitted to flow at a ratio, which may differ depending on the amount of physical properties demanded for the multi-layer structure film to be formed, but is generally 10:1, namely 10 or more desirably 100:1, namely 100 or more.

Whereas, when a silicon halide-based starting gas is to be employed, since the gas of a silicon halide compound has substantially no ability to form a film, its film forming ability must be enhanced by introducing hydrogen gas together with the silicon halide gas and permitting the active species of hydrogen generated by decomposition by glow discharging and the active species of the silicon halide compound to react with each other.

On the other hand, the quality of the film formed depends on the amounts of the activated species of hydrogen and the activated species of silicon halide in the plasma. The amount of hydrogen gas introduced may be generally within the limited range from ¼ to 1 of the flow rate of $SiF_4$.

Also, when a mixture of $SiF_4$ and hydrogen is decomposed by glow discharge to change arbitrarily the mixing ratio of the active species from $SiF_4$ and the active species of hydrogen, since both $SiF_4$ and hydrogen are decomposed by glow discharge, it is difficult to change arbitrarily the mixing ratio of the active species from $SiF_4$ and the active species of hydrogen, that is, to set freely the mixing ratio of the active species in the plasma.

For this reason, in the present invention, by introducing active species of hydrogen in place of hydrogen gas into the reaction space, the amount of the active species is controlled.

By doing so, even if the flow rate of the active species of hydrogen may be changed, for example, between 0.01 and 66% of the flow rate of $SiF_4$, film formation can be done at any mixing ratio. The characteristics of the film can be controlled by the amount of the active species of hydrogen introduced.

FIG. 1 shows an example of a preferable device for practicing the method for forming a deposited film of multi-layer structure of the present invention.

101 is an introducing inlet for the subjective starting gas and 102 an introducing inlet for the objective starting gas. 103 is an electromagnetic valve of three-way cock, which is connected to a gas introducing pipe 104 connected to within the reaction chamber 100 or gas discharging pipe 105 connected to the evacuation device 106. 107 is an electrode connected to the RF power source 111, having a structure capable of exciting glow discharging plasma with the electrode 108 below. 109 is a substrate. 110 is a vacuum evacuation device for evacuating the reaction chamber.

112 is an inlet for introducing $H_2$, which is connected to a reaction pipe 113 made of a quartz pipe, the reaction pipe 113 is placed in a cavity 114 of microwave, and by application of microwave power on the cavity 114, plasma is excited to decompose the $H_2$ molecules within the reaction pipe 113 to activated H atoms. The decomposed H atoms are introduced into the reaction chamber 100.

The present invention is described in detail by referring to Examples.

EXAMPLE 1

By use of the device for forming a deposited film shown in FIG. 1, a reading sensor having a multi-layer structure film of a-SiGe:H(F) film and a-Si:H(F) film was formed. Through the gas introducing pipe 101, $SiF_4$ gas and $H_2$ gas as the subjective starting material gases were introduced into the chamber 100. Also, through the gas introducing pipe 102, $GeF_4$ gas was also introduced into the chamber 100 as the objective starting material. The gas introducing pipe 102 was connected to an electromagnetic valve 103 equipped with a three-way-valve, so that the gas introducing pipe 102 may be changed over selectively by electrical signals to be connected to the gas introducing pipe 104 or to the gas discharging pipe 105. Also, through th gas introducing pipe 112, hydrogen gas was introduced into the reaction pipe 113, and microwave power was applied on the microwave cavity 114 to excite plasma within the reaction pipe 113. The hydrogen atom radicals formed were introduced into the reaction chamber. The gas discharging pipe 105 was connected to the vacuum evacuating device 106.

With such a device constitution, $GeF_4$ gas always at a constant flow rate was introduced intermittently by electrical signals into the chamber. The gas introduced was subjected to glow discharge decomposition by high frequency power of 13.56 MHz applied between the electrodes 107 and 108, whereby through the chemical reaction of the radicals generated with H atoms, a multi-layer structure film of a-SiGe:H(F) and a-Si:H(F) was deposited on a glass substrate (Corning 7059).

The gas not contributed to the film formation is discharged out of the chamber by the vacuum evacuation device 110.

In the following, the method for preparation of a reading sensor comprising a multi-layer structure of a-SiGe:H(F) film and a-Si:H(F) film within the sensor is to be described.

$SiF_4$ gas was introduced at 39.73 sccm through the gas introducing pipe 101, and $GeF_4$ gas at 0.4 sccm through the gas introducing gas 102 into the chamber. Through the gas introducing pipe 112, $H_2$ gas was introduced at 0.6 sccm and He gas at 10 sccm into the reaction pipe 113, and microwave power of 300 W was applied on the microwave cavity 114. As a result, plasma was generated in the reaction pipe.

As the substrate, Corning 7059 glass was employed. The glass substrate temperature was set at 300° C.

The pressure in the chamber was 300 mTorr and the difference between the case when $GeF_4$ was flowed and the case when no $GeF_4$ was flowed was within 2 mTorr. With this state, 30 W of high frequency power of 13.56 MHz was applied (power density 1 W/cm$^2$).

Even if the flow of $GeF_4$ was turned on or off, substantially no change was observed in the discharged state.

Under this state, the three-way valve on the introducing pipe of $GeF_4$ was changed over every 30 seconds. After repeating on-off of the three-way valve for about 200 times, discharging was halted by stopping the gas feeding, and the substrate was cooled to room temperature and taken out from the reaction chamber. After equipped with a comb-shaped electrode of aluminum (gap length 200 μm) in another vacuum vapor deposition device, the sample was placed in a vacuum cryostat, and dark electroconductivity ($\sigma$p) and electroconductivity $\sigma$p during photoirradiation of 600 nm, 0.3 mW/cm$^2$ were measured.

The values obtained were as follows.

$\sigma d = 5 \times 10^{-13}$ S/cm
$\sigma p = 4 \times 10^{-16}$ S/cm

Thus, an optical sensor with an extremely good $\sigma p/\sigma d$ ratio was obtained.

EXAMPLE 2

By use of the device shown in FIG. 1, an optical diode of PIN structure was prepared on a glass substrate having an ITO film of 1000 Å deposited thereon. After the substrate was set, the substrate temperature was maintained at 250° C. First, through the gas introducing pipe 101, $SiF_4$ gas added with 3000 ppm of $B_2H_6$ as the subjective starting material gas and was introduced at 35 sccm into the chamber 100.

Also, through the gas introducing pipe 102, $C_2F_6$ gas was introduced as the objective starting material gas at 5 sccm into the chamber 100. At the same time, $H_2$ gas at 1 sccm and He gas at 10 sccm were introduced through the gas introducing pipe 112 into the reaction pipe 113, and microwave of 300 W was applied. A high frequency power of 30 W was applied from RF power source on the electrode 107 to establish plasma. The three-way valve connected to the gas introducing pipe 102 was turned on for 50 seconds and off for 25 seconds, which on-off cycle was repeated three times. As the result, a p-type film of a multi-layer structure of an a-SiC layer with a thickness of about 50 Å and an a-Si layer with a thickness of about 50 Å was formed to about 300 Å. Then, after $C_2F_6$ gas was replaced with $GeF_4$ gas, under the same conditions as described in Example 1, a non-doped multi-layer film of a-SiGe layer and a-Si layer was formed to about 9000 Å. Then, after the flow of $GeF_4$ gas was stopped, $SiF_4$ gas added with 3000 ppm of $PH_3$ was introduced at 40 sccm through the gas introducing pipe 101 into the chamber, $H_2$ gas at 0.6 sccm and He gas at 10 sccm through the gas introducing pipe 112 into the chamber, and 300 W of microwave was applied to establish plasma in the reaction pipe 113, and a high frequency power of 30 W was applied for 5 minutes to form a n-type a-Si film of about 300 Å thereon. After evacuating the gas thoroughly, the substrate was left to cool to room temperature, followed by vapor deposition of an aluminum electrode of 10 mm in diameter.

As a result, an optical diode of PIN structure comprising a glass substrate/ITO film/a p-type multi-layer structure film of a-SiC and a-Si/a non-doped multi-layer structure film of a-SiGe and a-Si/a n-type a-Si film/Al was formed. When the solar battery characteristics were measured by irradiation of light of AM-1, 100 mW/cm$^2$, good values of an open circuit voltage of 1.0 V, a short circuit current of 16 mA/cm$^2$ and a conversion efficiency of 9.8% were obtained.

EXAMPLE 3

On an aluminum substrate, according to the procedure shown in Table 1, an electrophotographic photosensitive member was formed from Al substrate/p-type a-Si layer/multi-layer film of a-SiGe and a-Si/multi-layer film of a-SiC and a-Si.

TABLE 1

| Layer | Starting material gas | | Film thickness |
|---|---|---|---|
| p-type a-Si layer | $SiF_4$ with $B_2H_6$ added $H_2$ He | 3000 ppm 35 sccm 0.6 sccm 10 sccm | 1 μ |
| Multi-layer film a-SiGe/a-Si | $SiF_4$ $H_2$ He $GeF_4$ (on/off 50 sec. interval) | 39.75 sccm 0.6 sccm 10 sccm 0.4 sccm | 20 μ |
| Multi-layer film a-SiC/a-Si | $SiF_4$ $H_2$ He $C_2F_6$ (on 100 sec., off 50 sec. interval) | 35 sccm 0.6 sccm 10 sccm 5 sccm | 5000 Å |

$SiF_4$ and $H_2$ gas were introduced through the introducing pipe 101, $GeF_4$ and $C_2F_6$ through the gas introducing pipe 102 and introduction of the gases into the reaction chamber was controlled by the three-way valve 103.

$H_2$ gas and He gas were introduced through the gas introducing pipe 112, microwave power of 300 W was applied to generate plasma in the reaction pipe 113 to form activated H atoms, which were then introduced into the reaction chamber 120.

Other film forming conditions were as follows:
inner pressure 300 m torr;
substrate temperature 250° C. When this electrophotographic photosensitive member was subjected to ⊕ corona charging for 0.2 sec., an acceptance potential of 380 V was obtained.

Then, when it was exposed to a semiconductor laser beam of 788 nm with an optical density of 2μJ, the potential became 30 V.

As described in detail above, according to the method for preparation of a multi-layer structure film of the present invention, characteristics can be remarkably improved. Also, the method of the present invention allows easy control of the production conditions and the process, and therefore is suitable for bulk production.

We claim:

1. A method for preparing a multi-layer structure film on a substrate in a reaction space according to a plasma-assisted chemical vapor deposition method by applying discharge energy to starting gases in said reaction space to effect film formation, comprising:

separately introducing into the reaction space a starting material gas (A) at a first flow rate (a) which is a major flow rate component, a starting material gas (B) at a second flow rate (b) which is a minor flow rate component and activated hydrogen wherein the second flow rate (b) is at most ½ of the first flow rate (a);

applying external discharge energy to said reaction space to generate a plasma with said starting material gas (A), said starting material gas (B) and said activated hydrogen;

forming a first deposited film layer on the substrate by permitting said starting material (A), said starting material (B), and said activated hydrogen to form a mixture and chemically react while maintaining the discharge energy applied at a substantially constant intensity and thereby produce the first deposited film layer on the substrate having a first composition; and forming at least a second deposited film layer on top of said first deposited film layer by varying said second flow rate (b) relative to said first flow rate (a) while maintaining the discharge energy applied to said reaction space at the substantially constant intensity applied when forming said first deposited film layer and thereby produce said at least second deposited film layer having a second composition different from said first composition so as to form a multi-layer laminated film of at least two layers of different compositions;

wherein each deposited film layer has a thickness in the range of from 10 Å to 200 Å.

2. The method according to claim 1, wherein a silicon compound is used as the starting material gas (A).

3. The method according to claim 2, wherein a germanium compound is used as the starting material gas (B).

4. The method according to claim 2, wherein a carbon compound is used as the starting material gas (B).

5. The method according to any one of claims 2 to 4, wherein hydrogen gas is contained in the starting material gas (A).

6. The method according to any one of claims 2 to 4, wherein hydrogen gas is contained in the starting material gas (B).

* * * * *